United States Patent [19]

Yoo

[11] Patent Number: 4,512,434

[45] Date of Patent: Apr. 23, 1985

[54] AERODYNAMIC BASS-REFLEX ENCLOSURE

[76] Inventor: Sin Y. Yoo, 14217 Peartree La., No. 21, Silver Spring, Md. 20906

[21] Appl. No.: 493,342

[22] Filed: May 10, 1983

[51] Int. Cl.[3] .................... H05K 5/00

[52] U.S. Cl. .................... 181/146; 181/156

[58] Field of Search .................... 181/144, 145, 146, 147, 181/151, 156, 199, 155; 381/89, 90

[56] References Cited

U.S. PATENT DOCUMENTS

| | | | |
|---|---|---|---|
| 3,037,081 | 5/1962 | Carlsson | 381/90 |
| 3,166,147 | 1/1965 | Greenfield | 181/145 |
| 3,696,886 | 10/1972 | Armstrong | 181/156 |
| 3,952,159 | 4/1976 | Schott | 181/156 X |

OTHER PUBLICATIONS

"Building Speaker Enclosures" by David Weems, Published by TAB Books, Inc., Catalogue No. 62-2309 of Radio Shack.

*Primary Examiner*—L. T. Hix
*Assistant Examiner*—Brian W. Brown
*Attorney, Agent, or Firm*—Benjamin J. Goldfarb

[57] ABSTRACT

A ported speaker enclosure is disclosed for extending the low-frequency range of the enclosure and increasing the intensity of the low-frequency range of reproduced sound wherein the size of the enclosure, the locations of the speakers, and the size and locations of the ducted ports are determined by relatively simple relationships based solely on speaker cone dimensions. In one form, a ducted port speaker enclosure is comprised of two bass-range speakers, or woofers, wherein one woofer is located in a predetermined position above the other on the enclosure. An open sector of a plurality of open sectors of the frame at the back of the topmost speaker faces towards the top and an opposite open sector faces towards the bottom of the enclosure of the two woofer system. A sound damping material is added to cover the top and bottom facing sectors of the topmost speaker. Insulation material of predetermined dimensions is affixed to the inside walls of the right and left sides of the enclosure. A sound duct of predetermined dimensions on the left side and a sound duct of similar dimensions on the right side within the enclosure are affixed to the inside of the enclosure front panel at respective openings thereof at predetermined locations. Each sound duct is also affixed to a sidewall. The sidewall of the enclosure within the top and bottom members of the sound duct is integral with and part of the respective sound duct and front opening. In another form, a ducted port speaker enclosure is comprised of one woofer and two ducted ports in predetermined locations; insulation of predetermined dimensions is also affixed on the inside walls of the enclosure. Provision is made for mounting a crossover network and additional speakers. Within the enclosure, damping material of predetermined configuration is affixed to the two sidewalls.

2 Claims, 16 Drawing Figures

AERODYNAMIC BASS-REFLEX ENCLOSURE

BACKGROUND OF THE INVENTION

1. Field of the Invention

The present invention relates to speaker enclosures and particularly to ducted port speaker enclosures.

2. Description of Prior Art

Sound may be defined as vibrations produced by an object. Whenever an object vibrates, it causes the surrounding air to compress and expand and, in turn, the compressions and expansions of the air near the source of the sound cause compressions and expansions in the air further away. The compressions and expansions are called sound waves. The pitch of the sound is determined by the frequency of its vibrations and is measured in hertz or Hz. The intensity of the sound is determined by the amplitude or distance the vibrating object moves as it vibrates and is measured in decibels or dB. Pitch affects the loudness but not the intensity of a sound where loudness is the apparent strength of the sensation received by the brain and the intensity refers to the amount of energy in the sound waves. The ear has a low sensitivity to low pitches such as the lowest note on a piano having a frequency of 27 Hz and some organ notes as low as 15 Hz. A sound with an intensity of 60 dB sounds louder at a frequency of 1,000 Hz than at 500 Hz so that a greater intensity is required at the lower frequencies to produce a loudness equivalent to that at the higher frequencies. The low frequencies from such instruments as the tympani and the bass guitar may be lost by the average listener because the intensities of the low frequencies either from recordings or even live performances may be below the range at which these vibrations may be heard.

Phonograph recordings are made with the use of microphones which change the sound waves into electric currents while the loudspeaker changes the electric currents back into sound waves. The loudspeaker must not only reproduce the sounds from the electric currents but must also provide means for in some way increasing the intensity of low frequency sounds to which the ear has relatively low sensitivity. The low intensities may be caused by losses occurring because of the sound reproducing process including the recording studio, the record processing, the turntable, and the speakers as well as the associated amplifiers, wiring, connectors, and the like.

Sound waves will expand outwardly from the source of the sound similar to ripples in a pool of water which are created when a pebble is dropped into it. When a wave encounters an interference such as a wall which forms a reflecting surface, the wave will be reflected and again expand but in a new direction depending on the orientation of the reflecting surface. In a speaker cabinet the sound wave will be reflected by each of the walls it encounters and the reflected waves will also encounter the walls to be again reflected while new waves are created by the vibrations of the speaker diaphragm. Each time there are new vibrations the process is repeated until the various elements of the composite sound in effect become turbulent, set up standing waves, resonance effects, and other phenomena which are exceedingly difficult to analyze and predict. Consequently, although the net effect may be capable of being measured, the causes can usually only be hypothesized because of the difficulty of examining the complexity of the sound waves within the cabinet under the influence of the vibrating diaphragms. Various formulae and concepts have been suggested to predict the performance of speaker enclosures, however, in the final analysis, the human ear is the determining factor as to whether a particular speaker enclosure is producing sounds at the proper intensities over the listening range.

Speaker enclosures for enhancing the low frequency sounds are well known in the art and are usually referred to as bass-reflex or ported boxes; the ports which are a combination of a sound duct and its associated port opening are sometimes referred to as ducted ports. They contain one or more woofers or low-frequency range speakers, tweeters or high-frequency speakers, and probably one or more mid-range speakers, and are tuned with ducted ports. As described by David Weems in "Building Speaker Enclosures", published by TAB Books, Inc., Catalogue No. 62-2309 of Radio Shack, the design and construction of several types of ported boxes are developed from mathematical formulae and curves. For example, the speaker's bass performance in ported boxes of various cubic dimensions include these specifications: $f_s$—the driver's frequency of free air resonance; $Q_{TS}$—the driver's resonance magnification at resonance; and $V_{AS}$—the driver's compliance stated in terms of the air volume that has an equivalent compliance for that driver. From these specifications, a determination is made of box volume, box resonance frequency and system cut-off frequency using charts, pocket calculator or computer. For the Thiele ported box, for example, for $f_s=25$ Hz, the box volume of 15 cubic feet is required; for $f_s=40$ Hz, a volume of 5 cubic feet is required. A lower frequency is achieved by employing the ported ducts. U.S. Pat. No. 3,037,081 discloses an acoustic resonator with a woofer and a ducted port wherein there is a combination of a low value of the volume parameter and various combinations specified in order to increase the equivalent mechanical resistance in series with the diaphragm of the loudspeaker. U.S. Pat. No. 3,952,159 discloses a bass-reflex reproducing system employing a woofer, a tweeter, and a ducted port and exhibiting a predetermined compliance in order to achieve the low frequency response.

There is a need for a small inexpensive speaker enclosure which can be readily constructed by a do-it-yourselfer which is based on experimental determinations of the various enclosures and ducted port parameters to achieve the desired low-frequency range of sound rather than based on computations which do not factor the human response into its output. The equations used in the prior art described hereinbefore are based generally on broad assumptions as to the behavior of the sound waves within the enclosure and are approximations as to the true character of the predicted sound output. Usually complex tuning adjustments are required to achieve pleasing results over the broad band of reproduced sound when designs are based solely on computations in other than relatively large and expensive enclosures.

SUMMARY OF THE INVENTION

An object of the present invention is to provide a small, relatively inexpensive ducted port speaker enclosure.

Another object of the present invention is to provide a ducted port speaker enclosure which extends the low-frequency range of the reproduced sound and increases the intensity of the low-frequency sound vibrations.

A further object of the present invention is to provide a ducted port speaker enclosure wherein its geometry including the size of the enclosure, the locations of the speakers, and the sizes and locations of the ducted ports are based solely on the dimensions of said speakers.

These and other objects and advantages will become more apparent from the detailed description thereof taken with the accompanying drawings.

DESCRIPTION OF THE PREFERRED EMBODIMENT

Two-Woofer Speaker System

Figure 1A:
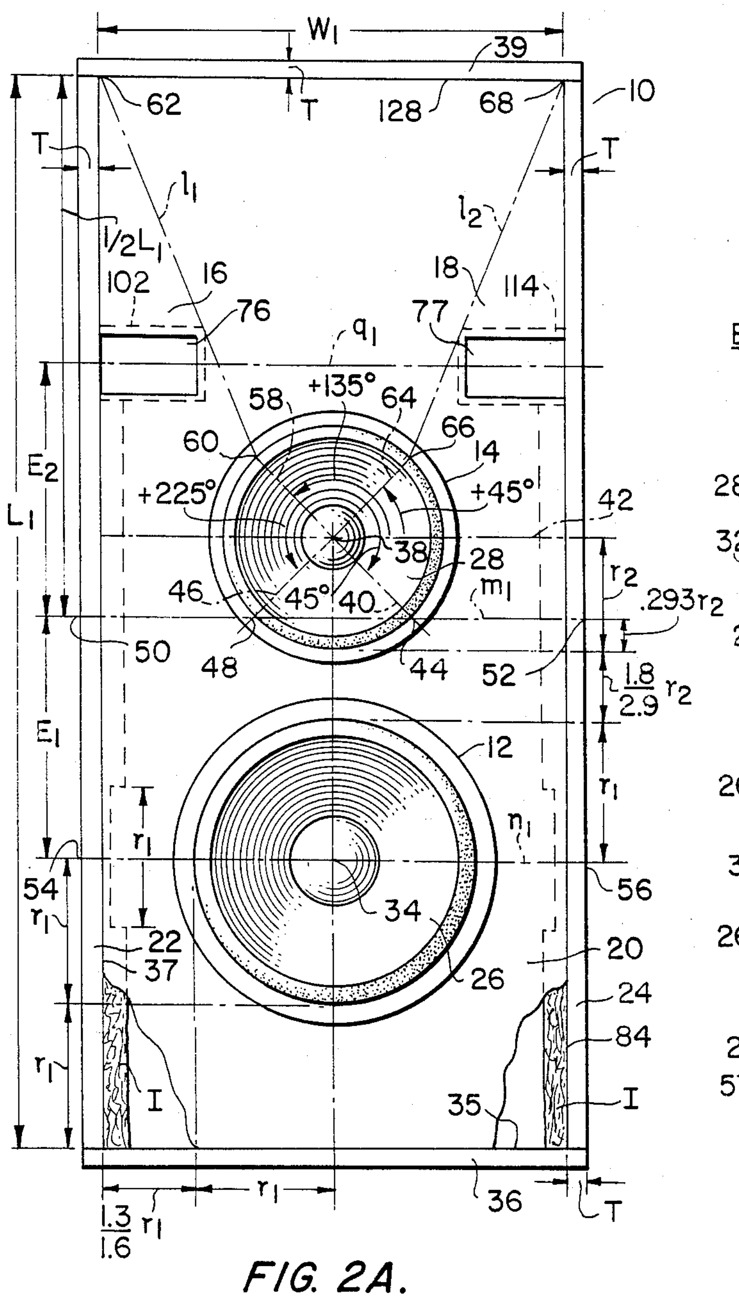
FIG. 1A is a fragmentary front view of a 2-woofer ducted port speaker enclosure.
Figure 1B:
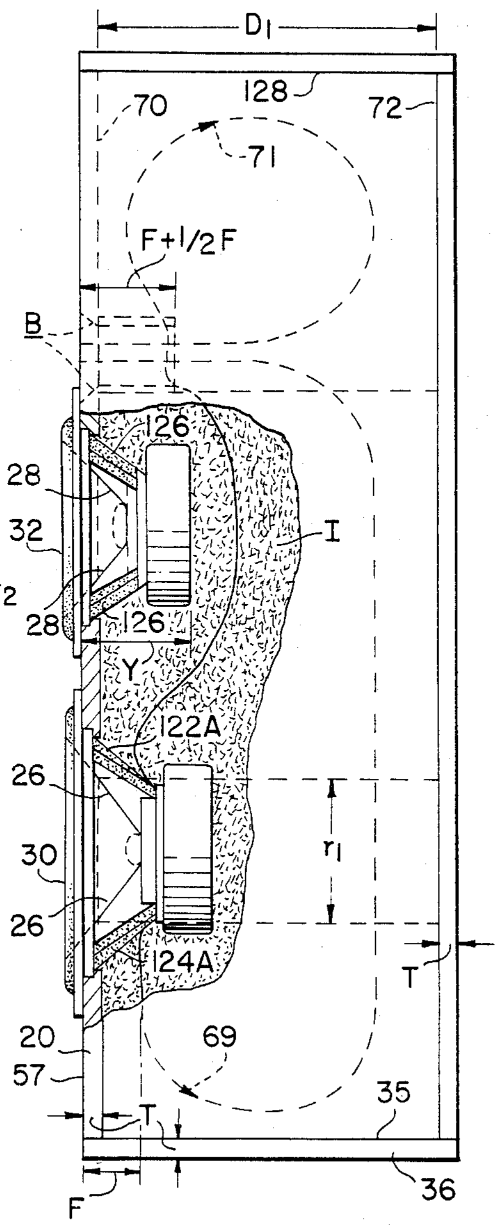
FIG. 1B is a fragmentary side view of a 2-woofer ducted port speaker enclosure including hypothesized flow paths of the air within the enclosure.

Referring to FIGS. 1A and 1B, the size of a two-woofer ported cabinet 10, the locations of a bass-range woofer speaker 12 and a bass-range woofer speaker 14, and the sizes and locations of a sound duct 16 and a sound duct 18 have been determined experimentally by the inventor for the purpose of extending the low-bass range of the reproduced sound from cabinet 10. All measurements can be determined from relatively simple relationships based solely on speaker dimensions as derived from experimental determinations by the inventor.

Speaker 12 is conventionally mounted in vertical alignment with and below speaker 14 on front panel 20 and both speakers are centered between panels 22 and 24 of cabinet 10 with cones 26 and 28 of speakers 12 and 14 respectively projecting within cabinet 10 through openings 30 and 32 respectively in panel 20. Speaker 12 is located so that its center 34 is at a distance of twice its cone radius $r_1$, or 2 $r_1$, above the inside wall 35 of bottom panel 36 and at a distance from the inside wall 37 of panel 22 that is the sum of cone radius $r_1$ plus 1.3/1.6 of cone radius $r_1$, or 1.81 $r_1$. The size relationship of speakers 12 and 14 is such that cone radius $r_1$ of speaker 12 may be equal to or greater than the cone radius $r_2$ of speaker 14. The inventor has determined experimentally that it is preferred that $r_2$ should be on the order of 4/5 of $r_1$.

It is to be noted that all dimensions of cabinet 10 and of ports 16 and 18 are inside dimensions unless otherwise noted.

Speaker 14 is located so that its center 38 is at a distance from center 34 of speaker 12 which is equal to the sum of $r_2+1.8/2.9\ r_2+r_1$ or $(1.62\ r_2+r_1)$.

Line $m_1$ is parallel to bottom panel 36 and line $m_1$ bisects panel 22 between bottom panel 36 and top panel 39. To locate line $m_1$, extend a line 40 from center 38 at an angle of $-45°$ from a horizontal axis 42 at center 38, said line 40 intersecting cone 28 at point 44, and extend a line 46 from center 38 at an angle of $+225°$ from said axis 42, said line 46 intersecting cone 28 at a point 48. Line $m_1$ is a straight line passing through points 44 and 48 respectively and intersecting panels 22 and 24 at a point 50 and a point 52 respectively.

Line $n_1$ passes through center 34 of speaker 12 and is parallel to line $m_1$. Line $n_1$ intersects panels 22 and 24 at a point 54 and a point 56 respectively. Distance $E_1$ between lines $m_1$ and $n_1$ is $(r_1+1.8/2.9\ r_2+0.293\ r_2)$ or $E_1=r_1+0.914\ r_2$.

Length $L_1$ of cabinet 10 is twice the sum of distance $E_1$ plus twice $r_1$ or $L_1=2\ (E_1+2\ r_1)$.

Width $W_1$ of cabinet 10 is twice $(r_1+1.3/1.6\ r_1)$ or $W_1=3.625\ r_1$.

To locate line $l_1$ along wall 57, extend a line 58 from center 38 at an angle of $+135°$ from axis 42, said line 58 intersecting cone 28 at point 60; line $l_1$ extends from point 60 to the intersection of panels 20, 22, and 39 at point 62. Similarly, to locate line $l_2$ along wall 57, extend a line 64 from center 38 at an angle of $+45°$ from axis 42, said line 64 intersecting cone 28 at point 66; line $l_2$ extends from point 66 to point 68 at the intersection of panels 20, 24, and 39.

Line $q_1$ is the center axis of sound ducts 16 and 18 and is parallel to line $m_1$. Line $q_1$ is located at a distance $E_2$ from line $m_1$ where distance $E_2$ is equal to distance $E_1$.

Depth $D_1$ of cabinet 10 from wall 70 to wall 72 is six times the depth F of cone 26 or $D_1=6F$.

Figure 4A:
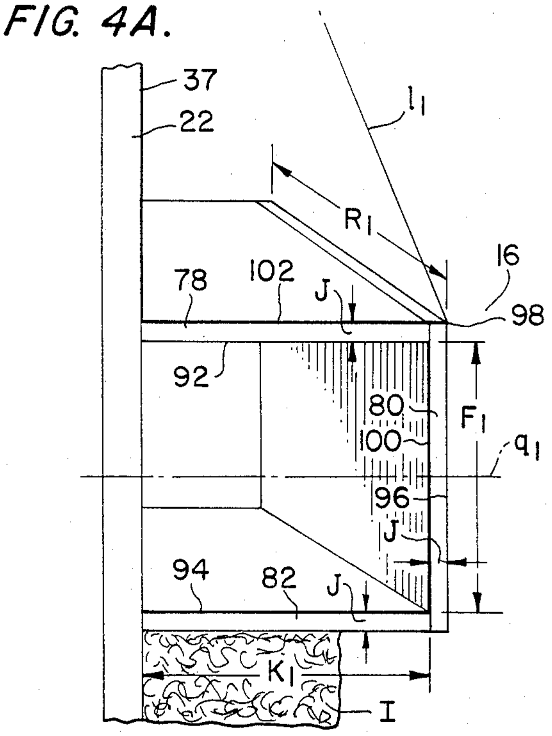
FIG. 4A is a fragmentary front perspective of the left hand port of a 2-woofer ducted port speaker enclosure.
Figure 4B:
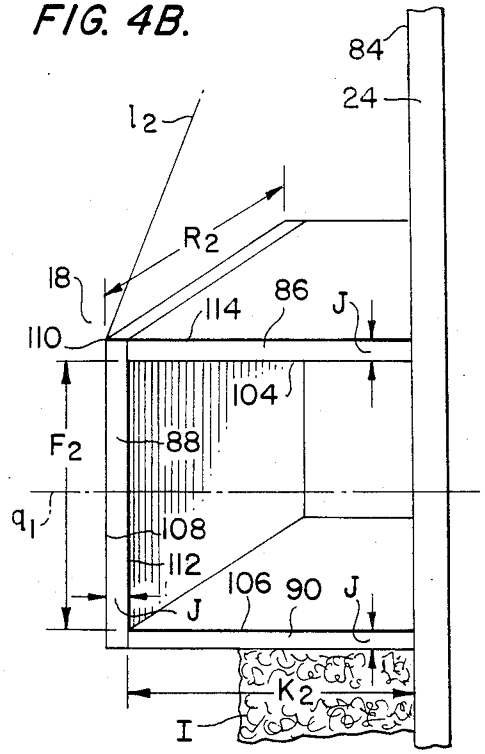
FIG. 4B is a fragmentary front perspective of the right hand port of a 2-woofer ducted port speaker enclosure.

Referring to FIG. 4A, sound duct 16 is affixed to wall 37 and to wall 70 at port opening 76 in panel 20, and is comprised of a top 78, a side 80, and a bottom 82 all orthogonally and sealingly joined together and with wall 37 to form a sound duct of which wall 37 between top 78 and bottom 82 forms a fourth side of said sound duct. Referring to FIG. 4B, sound duct 18 is affixed to wall 84 and to wall 70 a part at opening 77 in panel 20, and is comprised of a top 86, a side 88, and a bottom 90 all orthogonally and sealingly joined together with wall 84 to form a sound duct of which wall 84 between top 86 and bottom 90 forms a fourth side of said sound duct.

Thickness J of the respective top, side, and bottom of sound ducts 16 and 18 is on the order of ⅛ to 3/16 inch. The thickness T of front panel 20 depends on the mounting requirements of the speaker employed; a thickness of ½ inch is usually desired for a 6½-inch speaker while ⅝ to ¾ inch thickness is desired for an 8-inch speaker. The thickness T of panel 20 is uniform and in accordance with the maximum required ordinarily if different sized speakers are employed. The thickness of the other panels of cabinet 10 is similar to that of the front panel 20. All said panels are orthogonally joined together by sealed joints to form cabinet 10. The panels must have sufficient rigidity to withstand the vibratory forces of the reproduced sounds without flexing.

Height $F_1$, width $K_1$, and depth $R_1$ of sound duct 16 are determined as follows, referring to FIG. 4A:

a. Line $q_1$ bisects height $F_1$ which extends from inside wall 92 of top 78 to the inside wall 94 of bottom 82. Height $F_1$ measured along the outside wall 96 of side 80+the thickness J of top 78 will coincide with line $l_1$ at point 98 when line $l_1$ is projected onto the inside surface of panel 20. Note that height $F_1$ is the same dimension as the depth F of cone 26 in FIG. 1B.

b. Width $K_1$ extends from the inside wall 37 of panel 22 to the inside wall 100 of side 80. Width $K_1$ measured along the outside wall 102 of top 78+the thickness J of side 80 will coincide with line $l_1$ at point 98 also when line $l_1$ is projected onto surface 70 of panel 20.

c. Depth $R_1$ extends from said point 98 on the inside wall 70 of panel 20 orthogonally for a distance equal to $F_1+\frac{1}{2}F_1-T$.

Note that the total depth of sound duct 16 will be the sum of the depth $R_1$+the thickness T of the front panel 20.

The height $F_2$, $K_2$, and depth $R_2$ of sound duct 18 are determined as follows, referring to FIG. 4B:

a. Line $q_1$ bisects $F_2$ which extends from inside wall 104 of top 86 to the inside wall 106 of bottom 90. Height $F_2$ measured along outside wall 108 of side 88+the thickness J of top 86 will coincide with line $l_2$ at point 110 when line $l_2$ is projected onto the inside surface 70 of panel 20. Note that height $F_2$ is the same dimension as the depth of cone 26 in FIG. 1B; $F_1=F_2$.

b. Width $K_2$ extends from the inside wall 84 of panel 24 to the inside wall 112 of side 88. Width $K_2$ measured along the ouside wall 114 of top 86+the thickness J of side 88 will also coincide with line $l_2$ at point 110 when line $l_2$ is projected onto surface 70 of panel 20; $W_1=W_2$.

c. Depth $R_2$ extends from point 110 on the inside wall 70 of panel 20 orthogonally for a distance equal to $F_2+\frac{1}{2}F_2-T$. Note that the total depth of sound duct 18 will be the sum of depth $R_2$ plus the thickness of front panel 20; $R_1=R_2$.

Damping material I, having a thickness on the order of 1 inch, is affixed along the inside walls 37 and 84 of side panels 22 and 24 respectively, extending from the inside wall 35 of bottom panel 36 to the outside wall 116 of sound duct 16 and the outside wall 118 of sound duct 18 respectively. The inventor has determined experimentally that the section of material I opposite speaker 12 may be hollowed out to a thickness on the order of ½ inch to further enhance the bass; the exact height of said hollowed out section is not critical and may be on the order of half the diameter of said speaker, centered about line $n_1$, and extending the full depth of cabinet 10.

Figure 2A:
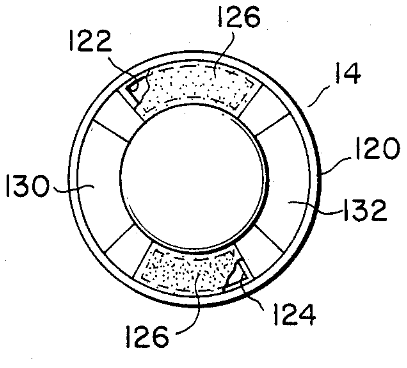
FIG. 2A is a fragmentary rear view of the top speaker of a 2-woofer ducted port speaker enclosure illustrating the location of the sound damping material on the top-facing and the bottom-facing sectors of the frame.

Bass speaker 14 has an overall depth Y which conventionally is slightly less than twice the depth F of speaker cone 26 when $r_2$ is on the order of 4/5 of $r_1$. Referring to FIG. 2A, speaker 14 has a frame 120 with a plurality of open sectors of substantially similar dimensions spaced substantially symmetrically about said frame such as, for example, Radio Shack Speaker Model No. 40-1006, wherein speaker 14 is shown as having the top-facing sector 122 and the bottom-facing sector 124 respectively covered with a sound damping material 126 for damping the sounds from said sectors but not interferring with the vibratory movements of cone 28. Material 126 such as, for example, metal or hard plastic, is on the order of 1/16 inch thick.

A conventional mid-range speaker (not shown) and a tweeter (not shown) may be installed in appropriate openings (not shown) in front panel 20 within the area bounded by line $q_1$, line $l_1$, the bottom side 128 of top panel 39, and line $l_2$. A conventional crossover network (not shown) may be mounted on the inside wall 70 of front panel 20 in either the area bounded by line $l_1$, top 102 of port 16, and inside wall 37 of panel 22 slightly above sound duct 16 or in the area bounded by line $l_2$, top 114 of sound duct 18, and inside wall 84 of panel 24 slightly above sound duct 18.

The side view of cabinet 10 in FIG. 1B illustrates a hypothesized flow of air mass within cabinet 10 caused by the impact of the sounds generated by speakers 12 and 14 and the presence of sound ports 16 and 18. It is hypothesized that the air mass will become turbulent and vibrational causing a pronounced flow of air mass in two directions from speaker 12. A first direction 69 will be downward along wall 70, across wall 35, and upward along wall 72, then curving upward towards sound ducts 16 and 18. A second direction 71 is hypothesized to be upward along wall 70, over speaker 14 and also by-passing speaker 14, across wall 128, downwardly part way along wall 72, then curving towards sound ducts 16 and 18, meeting the flow of air mass from the first direction 69 at the sound ducts as in FIG. 1B. The bass-range vibrations generated by speaker 14 are hypothesized to reinforce the bass-range vibrations generated by speaker 12 at said sound ducts. The sound vibrations from the uncovered sectors 130 and 132 respectively of frame 120 are hypothesized to reinforce the movement of the air mass generated by speaker 12 by exercising more pressure to the air mass within cabinet 10 and producing a deeper bass because of the increased pressure and resultant increased intensity as disclosed by the test results as hereinafter described.

Figure 2B:
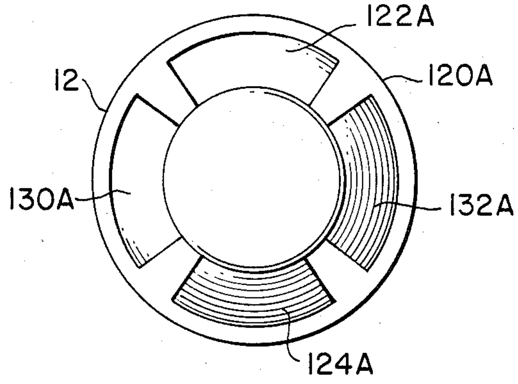
FIG. 2B is a rear view of the bottom speaker of the 2-woofer ducted port speaker enclosure illustrating the locations of the four sectors of the speaker frame.

As shown in FIG. 2B, frame 120A of speaker 12 has open sectors substantially similar to frame 120 speaker 14 and having a top-facing sector 122A, a bottom-facing sector 124A, a left-side facing sector 130A, and a right-side facing sector 132A. However, it is not necessary the frame 120A be similar to frame 120 or that it be oriented in any particular direction although it is preferred that its orientation be the same as for speaker frame 120 if a four-sector frame is used.

One-Woofer Speaker System

The procedures for developing the design of the one-woofer speaker system are substantially similar to those described for the two-woofer speaker system hereinbefore.

Figure 3A:
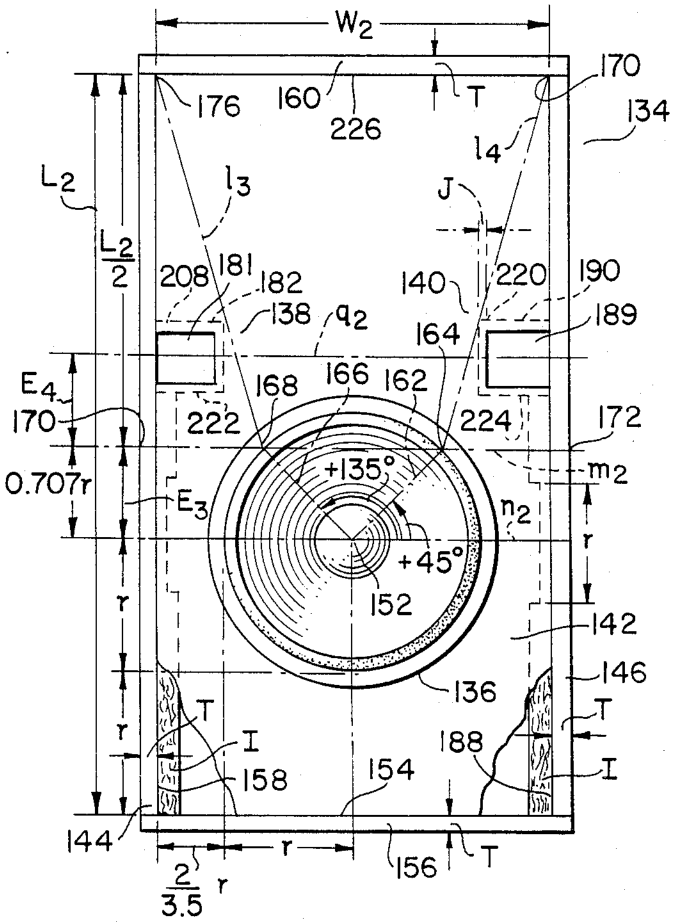
FIG. 3A is a fragmentary front view of a 1-woofer ducted port speaker enclosure.
Figure 3B:
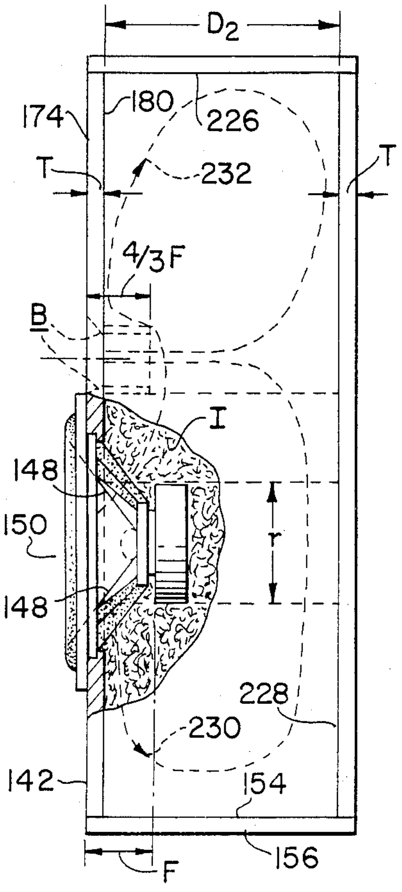
FIG. 3B is a fragmentary side view of a 1-woofer ducted port speaker enclosure including the hypothesized flow paths of the air mass within the enclosure.

Referring to FIGS. 3A and 3B, the size of the one-woofer ported cabinet 134, the position of the bass-range woofer speaker 136, the sizes and locations of a sound duct 138 and a sound duct 140, have been determined experimentally by the inventor for the purpose of extending the bass-range of the reproduced sound from cabinet 134. All measurements can be determined from relatively simple relationships based solely on speaker dimensions.

Speaker 136 is mounted on panel 142 and centered between panels 144 and 146 of cabinet 134 with cone 148 of speaker 136 projecting within cabinet 134 through opening 150 in panel 142. Speaker 136 is located where its center 152 is at a distance of twice the radius r of its cone 148 above the inside wall 154 of bottom panel 156 and at a distance from the inside wall 158 of panel 144 which is the sum of cone radius $r+2/3.5$ r or 1.57 r.

Line $m_2$ is parallel to bottom panel 156 and it bisects panel 144 between bottom panel 156 and top panel 160. To locate line $m_2$, extend a line 162 from center 152 at an angle of $+45°$ from a horizontal axis $n_2$ passing through center 152, said line 162 intersecting cone 148 at point 164, and extend a line 166 from center 152 at an angle of $+135°$ from said line $n_2$, said line 166 intersecting cone 138 at point 168. Line $m_2$ is a straight line passing through points 164 and 168 respectively and intersecting panels 144 and 146 at points 170 and 172 respectively. Lines $m_2$ and $n_2$ are parallel; the distance between them is $E_3=0.707$ r.

All dimensions of cabinet 134 and of sound ducts 138 and 140 are inside dimensions unless otherwise noted.

Length $L_2$ of cabinet 134 is twice $(r+r+0.707\ r)$ or $L_2=5.414$ r.

Width $W_2$ of cabinet 134 is twice 1.57 r or $W_2=3.14$ r.

Line $l_3$ extends from point 168 along outside wall 174 of front panel 142 to point 176 at the intersection of panels 142, 144, and 160. Line $l_4$ extends from point 164 along outside wall 174 of front panel 144 to point 170 at the intersection of panels 142, 146, and 160.

Line $q_2$ is the center axis of ports 138 and 140 and is parallel to line $m_2$. Line $q_2$ is located at a distance $E_4$ from line $m_2$ where distance $E_4$ is equal to distance $E_3$ or $E_4=0.707$ r.

The depth $D_2$ of cabinet 134 from inside wall 180 of panel 142 to the inside wall 182 of panel 184 is six times the depth F of cone 138, or $D_2=6F$.

Figure 5A:
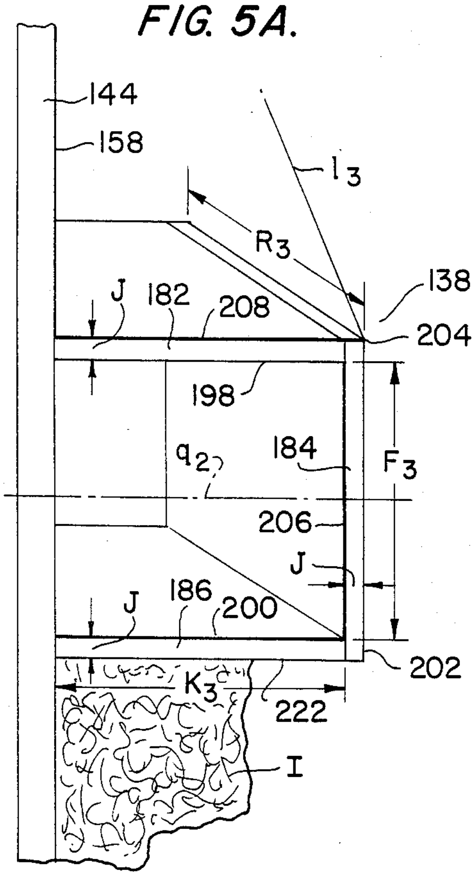
FIG. 5A is a fragmentary front perspective of the left hand port of a 1-woofer ducted port speaker enclosure.
Figure 5B:
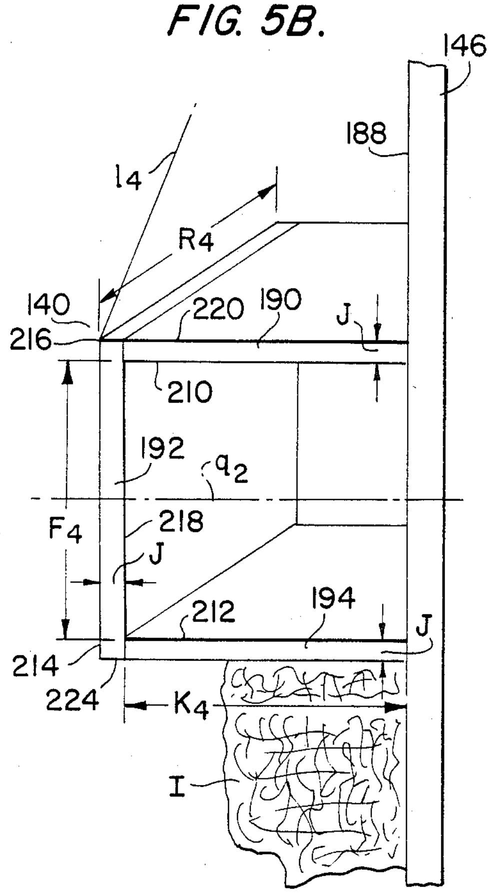
FIG. 5B is a fragmentary front perspective of the right hand port of a 1-woofer ducted port speaker enclosure.

Referring to FIGS. 5A and 5B, sound duct 138 is affixed to the inside wall 158 of panel 144 and to the inside wall 180 of front panel 142 at a port opening 181 in said panel 142 and is comprised of a top 182, side 184, and bottom 186 all orthogonally and sealingly joined together with wall 158 to form a sound duct of which wall 158 between top 182 and bottom 186 forms a fourth side of said sound duct. Sound duct 140 is affixed to the inside wall 188 of panel 146 and to the inside wall 180 of front panel 142 at a port opening 189 in said panel 142 and is comprised of a top 190, side 192, and bottom 194 all orthogonally and sealingly joined together with wall 188 to form a sound duct of which wall 188 between top 190 and bottom 194 forms a fourth side of said sound duct.

The thickness J of the respective top, side and bottom of sound ducts 138 and 140 respectively is on the order of $\frac{1}{8}$ to 3/16 inch. The considerations related to thickness T of the panels of cabinet 134 are similar to those for the panels of cabinet 10 hereinbefore described.

All said panels are orthogonally joined together in sealed joints to form cabinet 134. The panels must be rigid in order to withstand the vibratory forces of the reproduced sounds without flexing.

The height $F_3$, with $K_3$, and depth $R_3$ of sound duct 138 are determined as follows, referring to FIG. 5A:

a. Line $q_2$ bisects height $F_3$ which extends from the inside wall 198 of top 182 to the inside wall 200 of bottom 186. Height $F_3$ measured along the outside wall 202 of side 184+thickness J of top 182 will coincide with line $l_3$ at point 204 when line $l_3$ is projected onto the inside surface 180 of panel 142. Note that height $F_3$ is the same dimension as the depth F of cone 148 in FIG. 3B.

b. Inside width $K_3$ extends from the inside wall 158 of panel 144 to the inside wall 206 of side 184. Width $K_3$ measured along the outside wall 208 of top 182+thickness J of side 184 will also coincide with line $l_3$ at point 204 when line $l_3$ is projected onto the inside surface 180 of panel 142.

c. Inside depth $R_3$ extends from point 204 on the inside wall 180 of front panel 142 orthogonally for a distance equal to $4/3F_3-T$. The total depth of sound duct 138 will be the sum of depth $R_3$+thickness of the front panel 142 or $4/3F_3$.

The height $F_4$, width $K_4$, and depth $R_4$ of sound duct 140 are determined as follows:

a. Line $q_2$ bisects height $F_4$ which extends from the inside wall 210 of top 190 to the inside wall 212 of bottom 194. Height $F_4$ measured along the outside wall 214 of side 192+thickness J of top 190 will coincide with line $l_4$ at point 216 when line $l_4$ is projected onto the inside surface 180 of panel 142. Note that height $F_4$ is the same distance as the depth of cone 148 (see FIG. 3B); $F_4=F_3$.

b. Width $K_4$ extends from the inside wall 188 of panel 146 to the inside wall 218 of side 192. Width $K_4$ measured along the outside wall 220 of top 190+the thickness J of side 192 will also coincide with line $l_4$ at point 216 when line $l_4$ is projected onto the inside surface 180 of panel 142; $K_4=K_3$.

c. Depth $R_4$ extends from point 216 on the inside wall 180 of front panel 142 orthogonally for a distance equal to $4/3F_4-T$. The total depth of sound duct 140 will be the sum of depth $R_4$+thickness of the front panel 142 or $4/3F_4$; $R_4=R_3$.

Damping material I, having a thickness on the order of 1 inch, is affixed along the inside wall 158 of panel 144 and inside wall 188 of panel 146, extending from inside wall 154 of bottom panel 156 to outside wall 222 of port 138, and from inside wall 154 of bottom panel 156 to outside wall 224 of port 140. The inventor has determined experimentally that the material I opposite speaker 136 should be hollowed out to a thickness on the order of $\frac{1}{2}$ inch; the exact height of said hollowed out section is not critical and may be on the order of $\frac{1}{2}$ the diameter of said speaker 136 centered about line $n_2$ and extending the depth $D_2$ of cabinet 134.

A conventional mid-range speaker (not shown) and a tweeter (not shown) may be installed in appropriate openings (not shown) in front panel 142 within the area bounded by line $q_2$, line $l_3$, inside wall 226 of top 160, and line $l_4$. A conventional crossover network (not shown) may be mounted on the inside wall 180 of front panel 142 either in the area bounded by line $l_3$, side 208 of top 182 and inside wall 158 of panel 144 slightly about sound duct 138, or in the area bounded by line $l_4$, wall 220 of top 190, and inside wall 188 of panel 146 slightly above sound duct 140.

Referring to FIG. 3B, the side view of cabinet 134 illustrates a hypothesized flow of air mass within cabinet 134 caused by the impact of sound vibrations from speaker 136 and the presence of sound ducts 138 and 140. As in the hereinbefore described two-woofer speaker cabinet 10, it is hypothesized that the air mass within cabinet 134 will become turbulent and vibrational by the sounds from speaker 136 causing a pronounced flow of air mass in two directions from speaker 136. A first direction 230 will be downward along wall 180, across wall 154, and upward along wall 228, then towards sound ducts 138 and 140. A second direction 232 is upward along wall 180, across wall 226, downward along wall 228, the towards sound ducts 138 and 140 effectively joining the air mass of the first direction 230 to reinforce the movement of the air mass of the first direction 230 and produce a deeper bass as shown by said test results.

It was experimentally determined by the inventor that bevelling the top and bottom edges of sound ducts 16 and 18 in FIG. 1B respectively and of sound ducts 138 and 140 in FIG. 3B respectively indicated on said Figures as B, resulted in a slight improvement in the quality of the sound output. However, bevelling these edges is not considered to be essential to a demonstration of the present invention.

The construction of either the two-woofer speaker cabinet 10 or of the one-woofer speaker cabinet 134 is relatively straightforward for a do-it-yourselfer or for a manufacturer. All the dimensions are based on dimensions of the speakers utilized. It is commonly known among handymen as to how to install the sound insulation material on the inside walls of the cabinets and the sound damping material sealingly covering the top and bottom sectors of the top woofer in the two-woofer speaker cabinet 10. A convenient opening at the back of the cabinets can readily be provided for having a sealingly fitted door (not shown) for reaching into the cabinets when installing the components. With respect to manufacturing tolerances, it is to be noted that the dimension $E_1$ must be substantially similar to dimension $E_2$ within ten (10%) percent for cabinet 10 and the dimension $E_3$ must be substantially similar to dimension $E_4$ within ten (10%) percent for cabinet 134. The remaining measurements could be within ten (10%) percent of the respective dimensions as determined from the various relationships without a serious degradation of the bass-range of sounds from said cabinets. All inner joints of said cabinets and respective sound ducts should be sealed with a conventional sealer such as, for example, caulking. It is preferred that the respective speakers in said cabinets fit into the openings which have been routed to provide a close fit between the respective front panels and said speakers. The cabinets constructed according to the present invention will be smaller and less expensive and provide a deeper bass-range than other speakers on the market today except possibly for the larger and more expensive speaker enclosures.

Figure 6A:
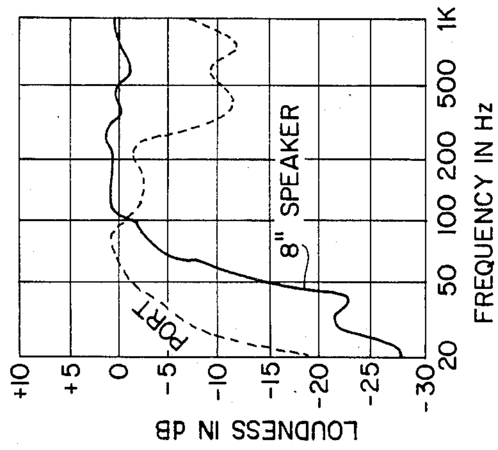
FIG. 6A shows the curves of loudness vs. frequency of a 2-woofer ducted port speaker enclosure as measured at the bottom 8-inch speaker and a port respectively.
Figure 6B:
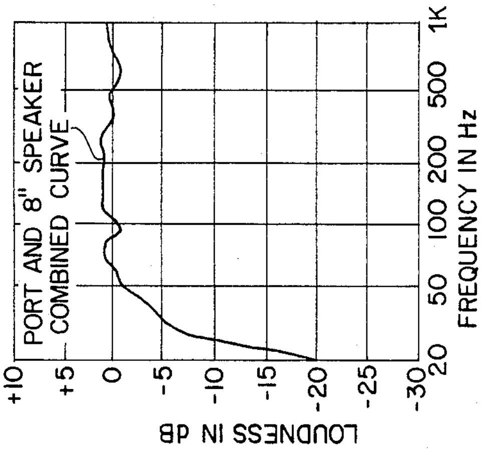
FIG. 6B shows the curve of loudness vs. frequency of a 2-woofer speaker enclosure which shows the summation of the curves of FIG. 6A.
Figure 7A:
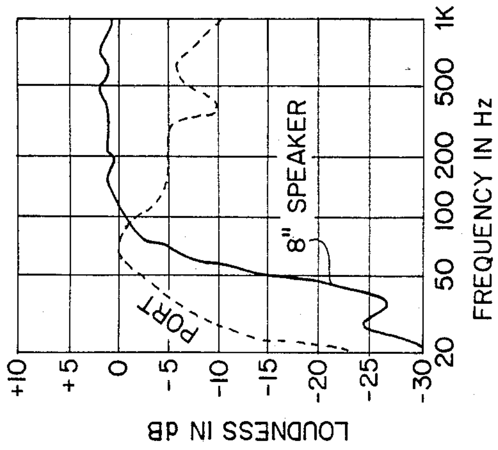
FIG. 7A shows the curves of loudness vs. frequency of a 1-woofer ducted port speaker enclosure as measured at the 8-inch speaker and at a port respectively.
Figure 7B:
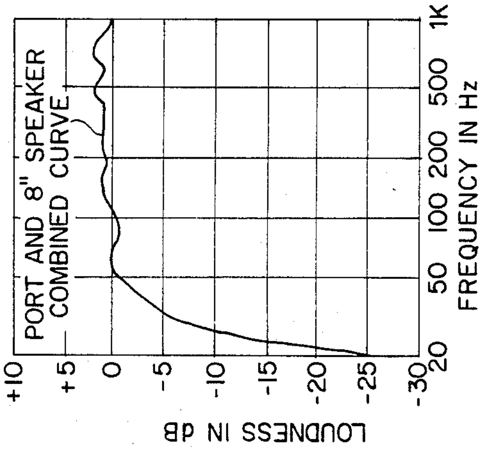
FIG. 7B shows the curve of loudness vs. frequency of a 1-woofer ducted port speaker enclosure which shows the summation of the curves of FIG. 7A.
Figure 8A:
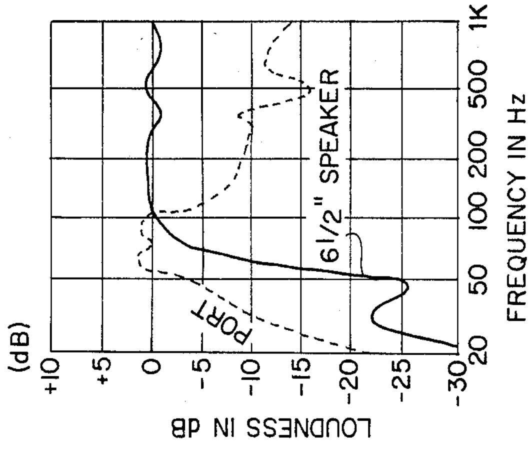
FIG. 8A shows the curves of loudness vs. frequency of a 1-woofer ducted port speaker enclosure as measured at the 6½-inch speaker and at a port respectively.
Figure 8B:
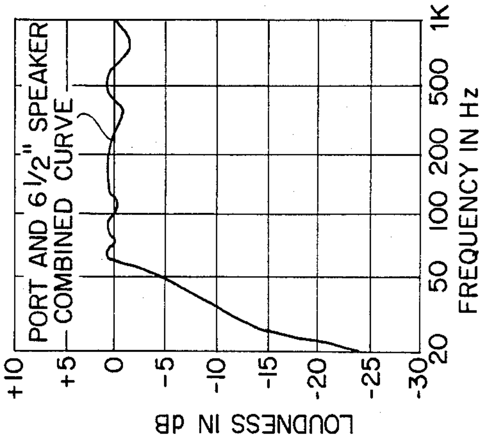
FIG. 8B shows the curve of loudness vs. frequency of a 1-woofer ducted port speaker enclosure which shows the summation of the curves of FIG. 8A.

FIGS. 6A, 6B, 7A, 7B, 8A, and 8B illustrate the relationship between loudness measured in decibels or dB along the vertical or ordinate axis and frequency measured in Hertz or Hz along the horizontal axis or abscissa wherein FIGS. 6A and 6B are for cabinet 10 and FIGS. 7A and 7B are for cabinet 134 with an 8-inch speaker and FIGS. 8A and 8B are for cabinet 134 with a $6\frac{1}{2}$-inch speaker. The measurements were made in an average size room with the microphone held vertically approximately one inch from the center of the speakers and ports measured. The measurements for the ports were made at a single port so that the measurement for sound ducts 16 and 18 were made only at sound duct 16 and the measurement for sound ducts 138 and 140 were made only at sound duct 138. The combined loudness-frequency relationships of the sound ducts and speakers as shown in FIGS. 6B, 7B, and 8B were obtained by summing the respective points on the curves in FIGS. 6A, 7A, and 8A. Real Time Analyzer No. 3347 manufactured by Bruen and Kjaer, Inc., of Denmark was employed for generating the sound frequencies and for measuring the loudness of the sound outputs. The dotted curves in FIGS. 6A, 7A, and 8A are for the loudness-frequency relationships at the respective sound ducts. The solid curve in FIG. 6A is the loudness-frequency relationship at the lower woofer in cabinet 10. The solid curves in FIGS. 7A and 8A are the loudness-frequency relationships of the speakers in cabinet 134 respectively.

In operation, speaker 14 acts to reinforce and enhance the bass-range sounds from speaker 12 as measured at sound ducts 16 and 18. It is to be noted in FIG. 6A that at 20 Hz the bass output for sound ducts 16 and 18 was on the order of −19 dB while the bass output from speaker 12 was on the order of −28 dB. The following were included in the measurements: speaker 12—8 inches—Radio Shack model #40-1006; speaker 14—$6\frac{1}{2}$ inches—Radio Shack model #40-1009. Cabinet 10 had an inside volume of 1.72 cubic feet and was 12 inches wide, $9\frac{1}{2}$ inches deep, and 26 inches in height. The sound ducts 16 and 18 were $2\frac{1}{4}$ inches wide, $1\frac{1}{2}$ inch deep, and $1\frac{1}{2}$ inch high.

Similarly, in FIG. 7A it is to be noted that at 20 Hz the bass-range output for sound ducts 138 and 140 was on the order of −23 dB while the bass-range output from speaker 136 was below −30 dB. The following were included in these measurements: speaker 136—8 inches—Radio Shack model #40-1006. Cabinet 134 had an inside volume of 1.07 cubic feet and was 11 inches wide, 9 inches deep, and $18\frac{3}{4}$ inches high. The sound ducts 138 and 140 were $1\frac{1}{2}$-inch in width, depth, and height respectively. In FIG. 8A it is to be noted that at 20 Hz the bass-range output for sound ducts 138 and 140 was on the order of −23 dB while the bass-range output from speaker 136 was below −30 dB. Cabinet 134 had an inside volume of 0.58 cubic feet and was 9 inches in width, $7\frac{1}{2}$ inches in depth, and $15\frac{5}{8}$ inches in height. The inside dimensions of sound ducts 138 and 140 were $1\frac{3}{8}$ inch in width, $1\frac{1}{8}$ inch in depth, and $1\frac{1}{4}$ inch in height. Speaker 136 was $6\frac{1}{2}$ inches and Radio Shack model #40-1009.

While only two embodiments of the present invention have been shown and described, it is not intended to be limited thereby but only by the scope of the appended claims.

I claim:

1. A sound reproducing cabinet for increasing the intensity of the low-frequency range of reproduced sounds, comprising:

a. a housing having a right wall, a left wall, a front panel, a back, a top, and a bottom, all of predetermined dimensions and enclosing a predetermined volume of air mass;

b. a sound damping means of predetermined dimensions affixed to said right wall and said left wall within said housing;

c. a first projection of vibratory sound pressures on said volume of air mass by a first speaker;

d. a second projection of vibratory sound pressures on said volume of air mass by a second speaker;

e. said first speaker mounted on the front panel of said housing at predetermined distances from said right and left walls and from the bottom of said housing and having a speaker cone of predetermined radius;

f. said second speaker having a frame extending into said housing and mounted on the front panel at a predetermined distance from said first speaker and from said right and left walls;

g. said frame having a plurality of open sectors of substantially similar dimensions spaced substantially symmetrically about said frame, at least one of said plurality of open sectors facing to the top of said housing and at least one of said plurality of open sectors facing to the bottom of said housing;

h. a damping means for reducing said second projection of vibratory sound pressures from said top- and bottom-facing open sectors of said second speaker;

i. a first sound duct having a top, a bottom, and a right side of predetermined dimensions affixed within said housing at a first opening on the front panel thereof, said first opening having substantially similar cross-sectional dimensions as said first sound duct and disposed at a predetermined distance from said second speaker and from the top of said housing;

j. said top and bottom of said first sound duct orthogonally affixed to said right side of said sound duct and to said left wall of said housing;

k. a second sound duct having a top, a bottom, and a left side of predetermined dimensions affixed within said housing at a second opening on the front panel thereof, said second opening having substantially similar cross-sectional dimensions as said second sound duct and disposed at a predetermined distance from said said second speaker and from the top of said housing;

l. said top and bottom of said second sound duct orthogonally affixed to said left side of said sound duct and to said right wall of said housing;

m. said predetermined volume, dimensions, and distances derived solely from the predetermined radius of said first speaker cone; and n. the combination of said sound damping means on said walls, said sound damping means on said top- and bottom-facing open sectors, and of said first projection of vibratory sound pressures by said first speaker augmented by said second projection of vibratory sound pressures by said second speaker at said first and second sound ducts, to increase the intensity of the low-frequency range of reproduced sounds at said sound ducts and extend the range of low-frequency sounds from said ducts below the range of low-frequency sounds from said speakers.

2.

a. a housing having a right wall, a left wall, a front panel, a back, a top, and a bottom, all of predetermined dimensions and enclosing a predetermined volume of air mass;

b. a damping means of predetermined dimensions affixed to said right wall and left wall within said housing;

c. a projection of vibratory sound pressures on said volume of air mass by a speaker;

d. said speaker mounted on the front panel of said housing at predetermined distances from said right and left walls and from the bottom of said housing and having a speaker cone of predetermined radius;

e. a first sound duct having a top, a bottom, and a right side of predetermined dimensions affixed within said housing at a first opening on the front panel thereof, said first opening having substantially similar cross-sectional dimensions as said first sound duct and disposed at a predetermined distance from said speaker and from the top of said housing;

f. said top and bottom of said first sound duct orthogonally affixed to said right side of said sound duct and to said left wall of said housing;

g. a second sound duct having a top, a bottom, and a left side of predetermined dimensions affixed within said housing at a second opening on the front panel thereof, said second opening having substantially similar cross-sectional dimensions as said second sound duct and disposed at a predetermined distance from said speaker and from the top of said housing;

h. said top and bottom of said second sound duct orthogonally affixed to said left side of said sound duct and to said right wall of said housing;

i. said predetermined volume, dimensions, and distances derived solely from the predetermined radius of said speaker cone; and j. the combination of said sound damping means on said walls and of said vibratory sound pressures in said air mass generated by said speaker at said first and second sound ducts, to increase the intensity of the low-frequency range of reproduced sounds at said sound ducts and extend the range of low-frequency sounds from said ducts below the range of low-frequency sounds from said speaker.

* * * * *

UNITED STATES PATENT AND TRADEMARK OFFICE
CERTIFICATE OF CORRECTION

PATENT NO. : 4,512,434

DATED : April 23, 1985

INVENTOR(S) : Sin Yong Yoo

It is certified that error appears in the above-identified patent and that said Letters Patent are hereby corrected as shown below:

In the Claims, last page of the Patent, column 12, line 6 and following lines, the Preamble to Claim 2 should appear as follows:

--A sound reproducing cabinet for increasing the intensity of the low-frequency range of reproduced sounds, comprising:--

Signed and Sealed this

*Twenty-second* Day of *October 1985*

[SEAL]

*Attest:*

DONALD J. QUIGG

*Attesting Officer*

*Commissioner of Patents and Trademarks—Designate*

UNITED STATES PATENT AND TRADEMARK OFFICE
CERTIFICATE OF CORRECTION

PATENT NO. : 4,512,434

DATED : 4/23/85

INVENTOR(S) : Sin Yong Yoo

It is certified that error appears in the above-identified patent and that said Letters Patent is hereby corrected as shown below:

In the Specification: Column 5, line 53, replace "$W_1 = W_2$" with --$K_1 = K_2$--. Column 6, line 37, delete "upward". Column 7, line 40, replace "144" with --142--. Column 7, line 47, replace "182" with --228--. Column 7, line 48, replace "138" with --148--.

In the Drawings, Sheet 2: Fig. 4A, apply reference numeral 116 to the downward facing side of the bottom panel of sound duct 16. Fig. 4B, apply reference numeral 118 to the downward facing side of the bottom panel of sound duct 18. Fig. 3B, apply the reference numeral 184 to the rear panel directly opposite the speaker.

Signed and Sealed this

*Ninth* Day of *September 1986*

[SEAL]

*Attest:*

DONALD J. QUIGG

*Attesting Officer* *Commissioner of Patents and Trademarks*